United States Patent [19]

Buie

[11] Patent Number: 4,546,456
[45] Date of Patent: Oct. 8, 1985

[54] READ-ONLY MEMORY CONSTRUCTION AND RELATED METHOD

[75] Inventor: James L. Buie, Panorama City, Calif.
[73] Assignee: TRW Inc., Redondo Beach, Calif.
[21] Appl. No.: 502,071
[22] Filed: Jun. 8, 1983
[51] Int. Cl.$^4$ .............................................. G11C 11/40
[52] U.S. Cl. ....................................... 365/227; 365/94
[58] Field of Search ................. 365/94, 104, 189, 226, 365/227, 230

[56] References Cited

U.S. PATENT DOCUMENTS 3,764,833 10/1973 Ayling et al. ........................ 365/227
3,859,637 1/1975 Platt et al. ............................. 365/227

Primary Examiner—Joseph A. Popek
Attorney, Agent, or Firm—Noel F. Heal; Robert M. Wallace

[57] ABSTRACT

A read-only memory circuit having, for a given memory access time, a power requirement of approximately one half of the power requirement needed to allow for a worst-case condition in which all bit storage locations may be in a binary memory state requiring maximum power consumption. Information stored in each row of the memory circuit is selectively complemented to minimize the power consumption in the individual rows and columns. Tables are used to store complement indicators for the rows and columns, and decoding circuitry selectively complements data read from the memory circuit, in accordance with the stored complement indicators.

8 Claims, 2 Drawing Figures

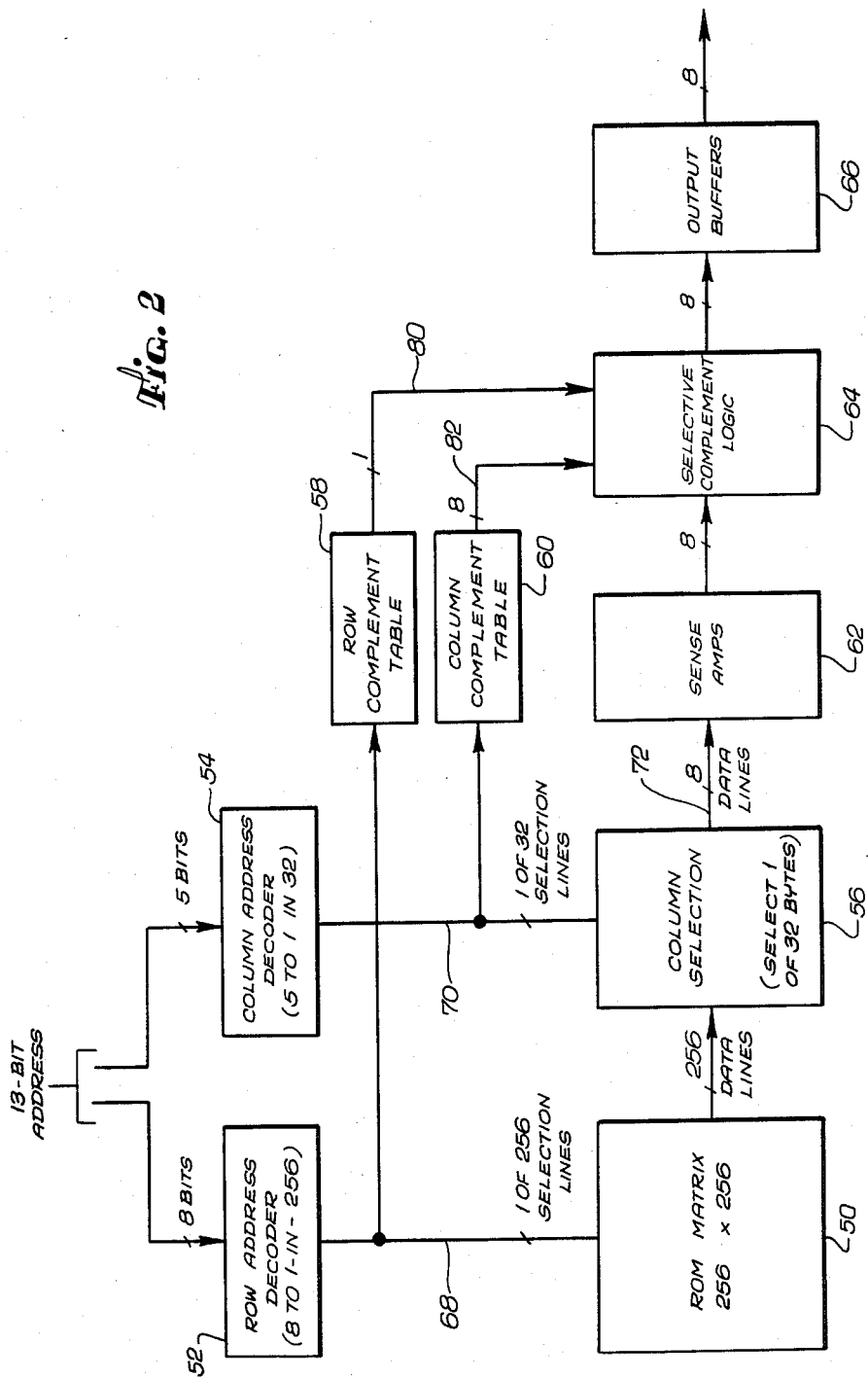

READ-ONLY MEMORY CONSTRUCTION AND RELATED METHOD

BACKGROUND OF THE INVENTION

This invention relates generally to read-only memories, and more particularly, to read-only memories fabricated in monolithic form. A read-only memory, or ROM, is one in which information is stored permanently, even when power is not applied to the device. The stored information in a ROM may not be conveniently changed. In other words, information may be read from the memory but not conveniently written into it. Read-only memories are widely used in digital computers and other equipment, for the storage of frequently used programs and data.

In an electronic ROM, digital information is stored in the form of selectively made electrode contacts at the storage locations of a plurality of binary digits, or bits. The bit storage locations are typically at row and column intersections of an addressable electrical matrix table or array. A binary one or zero is stored by either making or not making an electrical contact between conducting media defining the rows and columns of the array. Specifically, the selective contacts may be made by etching holes at selected locations in an oxide layer, to establish the desired connections. However, the invention to be described is not limited to any particular technique for selectively storing information in a read-only memory.

Information in a read-only memory is retrieved by energizing a selected row line and a selected column line. A sense amplifier can then detect whether or not there is electrical contact at the selected row and column intersection, and this is read as either a binary one or a binary zero. If the information to be stored is in the nature of random data, half of the bit storage locations will be coded as ones and the remainder as zeros. Since random data storage is likely to be an exceptional case, there will often be situations in which a majority of selected contacts are made at the available bit locations. The electrical capacitance or loading of the memory device is a direct function of the number of bit locations programmed. Thus, for a given power applied to a row or column, the circuit delay will be a direct function of the number of bit locations in the row or column that have been programmed for electrical contact. Conversely, for a given circuit delay or access time, the required power for a row or colun will depend directly on the number of bit locations programmed for electrical contact.

Given that the memory must be designed to operate at a specified maximum access time, the worst case from the standpoint of power consumption is a row and column combination having all the bit locations programmed to make electrical contact. Ideally, if the circuit designer knew in advance which rows and columns would be subject to heavy loading, the power supplies connected to those rows and columns could be appropriately designed to meet the access time requirements. Unfortunately, read-only memory circuits are usually designed for general-purpose use, and the designer is unaware of the form of the information to be stored in the circuit. Accordingly, the circuit must be designed to handle the worst-case loading condition for all row and column combinations. The power supply circuits for the memory must therefore be designed to provide power at a level that will in many instances be unnecessarily high.

Another way of stating this problem is that the "speed-power" product of the device is unnecessarily high. The speed-power product, or more precisely, the product of operation time and power, is a commonly encountered measure of the efficiency of monolithic circuits. In read-only memories, the speed-power product is higher than it would need to be if all row and column circuits did not have to be designed for the worst-case loading condition.

From the foregoing, it will be appreciated that there is a need for a read-only memory device that avoids having to provide a power supply for the worst-case loading condition in every row and column of the memory circuit. The present invention fulfills this need.

SUMMARY OF THE INVENTION

The present invention resides in a monolithic read-only memory circuit in which the speed-power product is substantially reduced. Basically, and in general terms, the circuit comprises an array of binary storage elements, the contents of which have been coded in such a manner that no more than a predetermined proportion of the elements are in the same memory state, subsidiary storage means, the contents of which is indicative of the manner in which the array of binary storage elements has been coded, memory addressing means for selectively retrieving data from the coded contents of the array of binary storage elements, and decoding means, for combining the retrieved coded data with the contents of the subsidiary memory means, to obtain decoded data.

More specifically, the read-only memory of the invention has its contents encoded by selective complementing or inversion of the bit storage elements, to achieve a condition in which not more than half of the elements that are connectable to a common power suppply will have the same selected memory state. The subsidiary storage means contains an indication of which of the memory elements have been inverted or complemented, and the decoding means re-inverts the stored memory elements for output.

Even more specifically, the read-only memory circuit of the invention includes a two-dimensional array having rows and columns of binary storage elements, the contents of which have been coded in such a manner that no more than a predetermined proportion of the elements in each row and in each column are in the same selected memory state, first auxiliary storage means, indicating for each row whether it is stored in a complemented or an uncomplemented state, second auxiliary storage means, indicating for each column whether it is stored in a complemented or an uncomplemented state, memory addressing means for retrieving data from a selected row and column location of the array of binary storage elements, and decoding means, for logically combining the retrieved coded data with corresponding row and column complementing indicators obtained from the first and second auxiliary storage means, to obtain decoded data.

Another aspect of the invention is embodied in a method for encoding the contents of a two-dimensional read-only memory circuit in the form of an array of rows and columns of binary storage elements, to minimize power requirements for a given memory access time. Basically, the steps of this method are: (a) complementing the contents of the first row of the memory array if the number of elements in a selected memory state exceeds a preselected proportion of the total number of elements in the row; (b) repeating the complementing step (a) for each succeeding row in the array; (c) changing corresponding bits in a row complement table to indicate which rows have been complemented; (d) complementing the contents of the first column of the memory array if the number of elements in the same selected memory state exceeds the selected proportion of the total number of elements in the column; (e) repeating the complementing step (f) for each succeeding column in the array; (f) changing corresponding bits in a column complement table, to indicate which columns have been complemented; and (g) repeating steps (a) through (f) until no further complementing of the memory elements is required.

It will be appreciated from the foregoing that the present invention represents a significant advance in the field of read-only memory circuits. In particular, the invention provides a memory circuit in which the power requirements for obtaining a required access time are reduced to approximately one half of the worst-case power requirement that would otherwise be effective. Other aspects of the invention will become apparent from the following more detailed description, taken in conjunction with the accompanying drawings.

BRIEF DESCRIPTION OF THE DRAWINGS

FIG. 2 is a block diagram of a more specific read-only memory circuit in accordance with the invention.

DESCRIPTION OF THE PREFERRED EMBODIMENT

Figure 1:
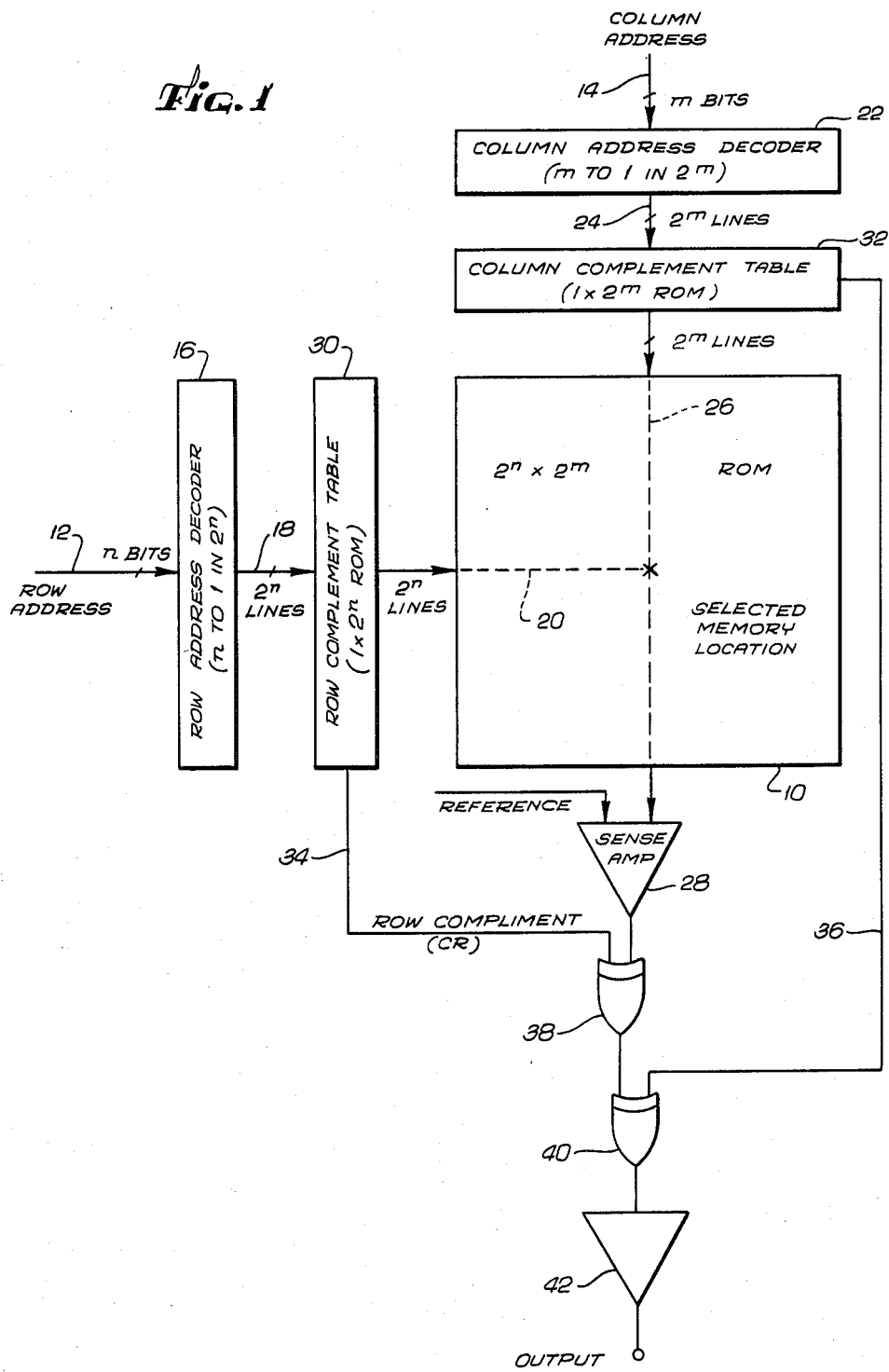
FIG. 1 is a block diagram of a read-only memory circuit in accordance with the invention.

As shown in the drawings for purposes of illustration, the present invention is concerned with read-only memory circuits. Since the contents of such circuits are not usually known at the time of chip design, power supplies for the circuits must be adequate to handle a worst-case condition in which all the bit storage elements in any row and column combination are set to a particular memory state that results in maximum power consumption.

In accordance with the invention, the power requirements for a read-only memory circuit are reduced to at most one half of the worst-case condition. FIG. 1 shows a read-only memory array, indicated by reference numeral 10, shown as having a storage capability of $2^n \times 2^m$ bits. As will soon be appreciated, however, the invention is not necessarily limited to two-dimensional memory arrays. The memory array 10 is accessed by means of an n-bit row address and an m-bit column address, as indicated at 12 and 14, respectively. A row address decoder 16 decodes the n-bit row address and produces a single output signal on one of $2^n$ lines 18, which are connected to memory array row conductors, one of which is shown at 20. Similarly, a column address decoder 22 decodes the m-bit column address and produces a single output signal on one of $2^m$ output lines 24, one of which is shown at 26. The content of the selected memory location where the lines 20 and 26 intersect, is read by a sense amplifier 28 to determine whether a logical one or a logical zero is stored at the location.

As described thus far, the read-only memory is conventional, in that decoded row and column addresses are employed to locate a selected memory location and to sense its content. However, the read-only memory circuit of the invention further includes a row complement table 30 and a column complement table 32. The row complement table is a $1 \times 2^n$ read-only memory. Each of its storage elements indicates whether a row has had its contents complemented before storing in the memory array 1. The row complement table 30 receives as input the 1-in-$2^n$ signal on lines 18 from the row address decoder 16, and produces an output signal on line 34 to indicate whether the selected row was complemented before storage in the array 10. Similarly, the column complement table 32 is a $1 \times 2^m$ read-only memory indicating which of the columns has had its contents complemented before storage in the array 10. The column complement table has a single output line 36 to indicate whether the selected column has had its contents complemented.

The complementing signals on lines 34 and 36 are logically combined with the output of the sense amplifier 28 in two exclusive OR gates 38 and 40. Specifically, the signal on line 34 is exclusive-ORed with the output of the sense amplifier 28 in XOR gate 38, and the result is exclusive-ORed with the signal on line 36 in XOR gate 40, the output of which is amplified as shown at 42 and used as output. An exclusive OR gate produces a logical-one output only if any one, but not both, of its inputs is a logical one. Thus, if there is a logical-one signal on line 34, indicating that the row in which the selected memory element is located was complemented, then the sense amplifier output will be complemented in XOR gate 38. If the sense amplifier output is also a one, the XOR gate will yield a zero output from the two logical-one inputs, but if the sense amplifier output is a zero the XOR gate will yield a logical-one output. Similarly, if the signal on line 36 is a one, indicating that the selected column was complemented, the output signal from the first XOR gate 38 will be complemented before output. If both the row and the column selected were complemented, the output of the sense amplifier 28 will be complemented twice, i.e. returned to its original state, before output from amplifier 42.

To maintain a power requirement below half of the worst-case condition, the rows and columns are selectively complemented before storage in the read-only memory. The procedure for complementing the rows and columns, and deriving corresponding values to store in the row and column complement tables 30 and 32 is a relatively simple one. First, the desired contents of the memory are examined row by row. If any row has more than half of its bits in the state that imposes the largest power demand on the circuit, the entire row is complemented. Suppose, for example, that the logical-one state is the one that imposes the largest power requirement. If more than half of the storage elements of a row are originally ones, then the row is provisionally complemented, i.e. ones are changed to zeros and zeros are changed to ones, and a one is provisionally stored in the row complement table, at a position corresponding to the location of the row.

When all the rows have been examined and selectively complemented in this manner, the same treatment is applied to each of the columns in turn, this time setting selected bits of the column complement table 32 to indicate which of the columns have been complemented. It will be apparent that, since complementing a column involves complementing one element of each row, it may be necessary to revise the state of some rows after complementing some of the columns. Accordingly, after the columns have all been examined, the rows are again examined one by one. If a row is found to have more than half of its elements in the logical-one state, for example, the row is complemented, and the corresponding bit in the row complement table is also complemented. It may be that a row complemented on this second pass has already been complemented, in which case the corresponding bit in the row complement table is changed from a one to a zero, or it may be that the row has not yet been complemented, in which case the bit in the row complement table is changed from a zero to a one.

This process is carried out repetitively, examining all the rows and all the columns in turn and selectively complementing them until no more changes are needed. It happens that the process is one that converges on the desired condition very rapidly, after only a very few cycles. When the desired condition had been reached, no row or column will impose a power requirement of more than half of the worst-case power condition. It will be understood that, after this selective complementing process, any particular bit storage element may be either subject to complementing once, because its row or its column is complemented, or twice, because both its row and its column are complemented, or not at all, if neither its row nor its column is complemented. The selectively complemented memory matrix is the one stored in the array 10, and the row and column complement table are stored in the memories 30 and 32.

As far as a user of the read-only memory circuit is concerned, the originally specified information is stored in the circuit. In fact, of course, the selectively complemented form of the information is stored, together with the row and column complement tables. When a selected bit of information is retrieved, by specifying its row and column address, the corresponding bits from the row and column complement tables 30 and 32 are exclusive-ORed with the retrieved bit of information, to transform it to its original uncomplemented form.

FIG. 2 shows a more specific form of a read-only memory circuit, for storing 8,192 words of eight bits each. The principal component of the circuit is a read-only memory matrix 50 of 256-by-256 bits. The matrix 50 could be of any suitable design. For example, it could take the form of one complex transistor with a common collector and 256 bases arranged in rows, each base having 256 emitters. The columns of the matrix take the form of conductors that are selectively connected to the emitters. When a signal is applied to one of the 256 bases and a column selection signal is applied to one of the 256 column lines, current flows through the column line if a connection has been established to an emitter, and this current is detected as a stored bit of a particular state, such as a logical one.

The FIG. 2 circuit also includes a row address decoder 52, a column adddress decoder 54, column selection logic 56, a row complement table 58, a column complement table 60, sense amplifiers 62, complementing logic 64, and output buffers 66. The row address decoder 52 converts the eight most significant bits of a thirteen-bit word address into a 1-in-256 row selection signal on lines 68, connected to the rows of the matrix 50. The column address decoder 54 converts the five least significant bits of the word address to a 1-in-32 word selection signal on lines 70, connected to the column selection logic 56. The column selection logic selects one of thirty-two groups of columns, each group having eight columns. Thus the column selection logic 56 applies a signal to a selected group of eight adjacent columns of the matrix 50, and derives signals on eight corresponding data lines 72, which are connected to the sense amplifiers 62. The eight bits of data from the sense amplifiers 62 are selectively complemented in the complementing logic 64, and finally passed to the output buffers 66.

The row selection signals on lines 68 are also transmitted to the row complement table 58, to select the corresponding bit stored there to indicate whether or not the row was stored in complemented form. This information is transmitted over line 80 to the complementing logic 64, where it is exclusive-ORed with each of the bits output from the sense amplifier 62. Since the columns are read in groups of eight, the column complement table 60 contains only thirty-two words of eight bits each indicating whether or not each selected column bit was stored in complemented form. This information is transmitted over line 82 to the complementing logic 64, where it too is exclusive-ORed with the corresponding bits output from the sense amplifiers 62.

It will be apppreciated from the foregoing that the present invention represents a significant advance in the field of read-only memories. In particular, the invention provides a read-only memory circuit in which the power requirements are reduced to approximately one half of the worst-case condition that would have to be provided for if the invention were not used. It will also be apreciated that, although specific embodiments of the invention have been described in detail for purposes of illustration, various modifications may be made without departing from the spirit and scope of the invention. Accordingly, the invention is not to be limited except as by the appended claims.

I claim:

1. A monolithic read-only memory circuit in which the speed-power product is substantially reduced, said circuit comprising:

an array of binary storage elements, the contents of which have been coded in such a manner that no more than a predetermined proportion of the elements are in a selected memory state;

subsidiary storage means, the contents of which are indicative of the manner in which the array of binary storage elements has been coded;

memory addressing means for selectively retrieving data from the coded contents of the array of binary storage elements; and decoding means, for combining the retrieved coded data with the contents of the subsidiary memory means, to obtain decoded data.

2. A monolithic read-only memory circuit as set forth in claim 1, wherein:

the array of binary storage elements is coded by selective complementing to minimize power requirements for reading data from the array.

3. A monolithic read-only memory circuit as set forth in claim 2, wherein:

the subsidiary storage means contains data indicative of whether or not the data stored in the array has been complemented; and the decoding means includes means for selectively complementing data read from the array, in accordance with the contents of the subsidiary storage means.

4. A monolithic read-only memory circuit in which the power requirement for a given memory access time is substantially reduced, said circuit comprising:

a two-dimensional array having rows and columns of binary storage elements, the contents of which have been coded in such a manner that no more than a predetermined proportion of the elements in each row and in each column are in the same selected memory state;

first auxiliary storage means, indicating for each row whether it is stored in a complemented or an uncomplemented state;

second auxiliary storage means, indicating for each column whether it is stored in a complemented or an uncomplemented state;

memory addressing means for retrieving data from a selected row and column location of the array of binary storage elements; and decoding means for logically combining the retrieved coded data with corresponding row and column complementing indicators obtained from the first and second auxiliary storage means, to obtain decoded data.

5. A monolithic read-only memory circuit as set forth in claim 4, wherein:

the selected memory state is the one that requires the larger power consumption; and the rows and columns of the array have been selectively complemented to minimize in each row or column the number of bits in the selected memory state, whereby the power requirement for the row or column is kept to at most half the level that would be required if every bit in the row or column were in the selected memory state.

6. A monolithic read-only memory circuit as set forth in claim 5, wherein:

the decoding means includes means for selectively complementing data read from the array, depending on the row and column complementing indicators obtained from the first and second auxiliary storage means.

7. A monolithic read-only memory circuit as set forth in claim 6, wherein:

the decoding means includes an exclusive OR circuit for combining output data with complementing indicators from the first and second auxiliary storage means.

8. A method of encoding the contents of a two-dimensional read-only memory circuit in the form of an array of rows and columns of binary storage elements, to minimize power requirements for a given memory access time, said method comprising the steps of:

(a) complementing the contents of the first row of the memory array if the number of elements in a selected memory state exceeds a preselected proportion of the total number of elements in each row;

(b) repeating the complementing step (a) for each succeeding row in the array;

(c) changing corresponding bits in a row complement table to indicate which rows have been complemented;

(d) complementing the contents of the first column of the memory array if the number of elements in the same selected memory state exceeds the selected proportion of the total number of elements in each column;

(e) repeating the complementing step (d) for each succeeding column in the array;

(f) changing corresponding bits in a column complement table to indicate which rows have been complemented; and (g) repeating steps (a) through (f) until no further complementing of the memory elements is required.

* * * * *